(12) United States Patent
Chen et al.

(10) Patent No.: US 7,451,415 B2
(45) Date of Patent: Nov. 11, 2008

(54) METHOD FOR PREDICTING INDUCTANCE AND SELF-RESONANT FREQUENCY OF A SPIRAL INDUCTOR

(75) Inventors: Chien-Chang Chen, Taoyuan County (TW); Yu-Ting Cheng, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 195 days.

(21) Appl. No.: 11/435,710

(22) Filed: May 18, 2006

(65) Prior Publication Data

US 2007/0214442 A1   Sep. 13, 2007

(30) Foreign Application Priority Data

Mar. 2, 2006   (TW) .............................. 95106923 A

(51) Int. Cl.
*H01F 27/28* (2006.01)
*G06F 17/50* (2006.01)

(52) U.S. Cl. ............................. 716/5; 336/232; 257/531
(58) Field of Classification Search ................ 716/1–18
See application file for complete search history.

(56) References Cited

U.S. PATENT DOCUMENTS

| | | | |
|---|---|---|---|
| 6,311,145 B1 * | 10/2001 | Hershenson et al. | ........... 703/2 |
| 6,588,002 B1 | 7/2003 | Lampaert et al. | |
| 6,665,849 B2 | 12/2003 | Meuris et al. | |

OTHER PUBLICATIONS

C. C. Chen et al. A Closed-Form Integral Model of Spiral Inductor Using the Kramers-Kronig Relations, IEEE Microwave and Wireless Components Letters, vol. 15, No. 11 (Nov. 2005), pp. 778-780.*
Greenhouse, IEEE Transaction on Parts, Hybrids, and Packaging, Jun. 1974, pp. 101-109, vol. PHP-10, No. 2.
Mohan et al., IEEE Journal of Solid-State Circuits, Oct. 1999, pp. 1419-1424, vol. 34.
Asgaran, The 14th International Conference on Microelectronics, Dec. 2002, pp. 247-250.
Jenei et al. IEEE Journal of Solid-State Circuits, Jan. 2002, pp. 77-80, vol. 37, No. 1.
Ansoft HFSS, 9.0 Version, Ansoft, http://www.ansoft.com/products/hf.

* cited by examiner

*Primary Examiner*—Vuthe Siek
*Assistant Examiner*—Aric Lin
(74) *Attorney, Agent, or Firm*—Birch, Stewart, Kolasch & Birch, LLP

(57) ABSTRACT

In this invention, a closed-form integral model for on-chip suspended rectangular spiral inductor is presented. The model of this invention bases on the Kramers-Kronig relations, field theory, and solid state physics to characterize a spiral inductor which RFIC designers could easily have the optimal design utilizing this analytical method. Meanwhile, this model can provide satisfactory prediction to the inductance and self-resonant frequency of the spiral inductor without complicated geometry analysis. Furthermore, unlike conventional formulations only based on circuit parameters, this model could safely predict the inductance and the self-resonant frequency when altering the material (excluding ferromagnetic materials) of a spiral inductor.

18 Claims, 4 Drawing Sheets

METHOD FOR PREDICTING INDUCTANCE AND SELF-RESONANT FREQUENCY OF A SPIRAL INDUCTOR

FIELD OF THE INVENTION

This invention relates to a method for predicting self-resonant frequency and inductance of two-port on-chip freely suspended spiral inductor.

DESCRIPTION OF PRIOR ARTS

There are many prior arts and articles relating to the present invention.

U.S. Pat. No. 6,311,145 B1 Optimal Design An Inductor and Inductor Circuit

This prior invention provides a method for optimally designing an inductor of inductor circuit. By means of using lumped parameters, an equivalent circuit of the inductor or inductor circuit will be presented. A posynomial expression will be obtained for each lumped parameter. Then quality factor or self-resonant frequency can be shown in posynomial form. Geometric program in posynomial form can be written to constrain on inductor performance specifications. This method can be utilized to optimally design inductors circuits.

U.S. Pat. No. 6,588,002 B1 Method and System for Predictive Layout Generation for Inductors with Reduced Design Cycle This prior invention provides a method and integrated design system for predictive layout generation for inductors with reduced circuit design cycle. The invention receives a number of parameters for an inductor, such as Number of Turns, Spacing, Width, Xsize, and Ysize, to determine parasitic resistor values and parasitic capacitor values which are used in simulating the circuit model comprising the inductor. Thus, an inductor layout is then generated that results in those parasitic values.

U.S. Pat. No. 6,665,849 B2 Method and Apparatus for Simulation Physical Fields

This prior invention provides a generic method for simulating electromagnetic field problems, and is designed for solving solution of partial differential equation by numerical method under condition of numerical stability. In order to obtain a consistent solution scheme, this prior invention introduces a dummy field for describing the underlying physical phenomena of non-uniqueness of the electric field and magnetic potentials. A special caution should be taken in the translation of the continuous field equation onto the discrete, comprising of nodes and links.

The prior invention provides a method for numerical analysis by directly solving the field equation modified by addition of a dummy field. The dummy field is preferably a scalar field. Then a least one parameter relating to a physical property of physical system will be outputting, such as field strength, a resistivity, an inductance, an energy value, etc. It also includes a step refining a mesh used in the numerical analysis in accordance with an embodiment of the prior invention.

This prior invention may provide an apparatus and include a data structure and computer program for use in numerical analysis of a simulation of a physical system. The field equations can be solving easily by addition of the dummy field and a representation of an n-dimensional mesh in a predetermined domain of the physical system.

Undoubtedly, this prior invention is absolutely an excellent method for simulating the frequency dependence of characteristic of electromagnetic field. The time-consumption, however, is an irremovable issue for a simulation tools and methods. In order to avoid this terrible condition, the model of the present invention provides a method for saving the wasted hours. The present invention provides a method could not only solving the problem of the time-consumption but also evaluating the self-resonant frequency and inductance of inductor without complicated analysis.

H. M. Greenhouse, "Design of Planar Rectangular Microelectronic Inductor," IEEE trans. Parts, Hybrids, Packag., vol. PHIP-10, pp. 101-109, June 1974.

This paper is actually a bible for designing microelectronic inductor. Unlike others, this paper points out the effect of negative mutual in the scale in the microelectronic world. Inductance of rectangular inductors can be evaluated by the geometric factors, such as track width, space between tracks, and number of turns. The frequency dependence of inductance and self-resonant frequency, however, can not be obtained by this paper and the complicated geometric analysis will confuse the engineers and designer very mush.

The model of the present invention can handle this situation. The self-resonant frequency can be easily calculated by physical based close form. The frequency dependence of the inductance can also easily calculate without complicated geometric analysis. Thus, the model of the present invention should simplify the work of complicated geometric analysis that Greenhouse even done and have more physical sense.

S. S. Mohan, M. M. Hershenson, S. P. Boyd, and T. H. Lee, "Simple Accurate Expressions for Planar Spiral Inductance," IEEE J. Solid-State Circuits, vol. 34, pp. 1419-1424, October 1999.

This paper presents several expressions for the DC inductance of square, hexagonal, octagonal and circular spiral inductors. By means of lumped inductor circuit model and fitted monomial expression, the simple and accurate results were presented. However, physical meaningless of lumped and fitted parameters can not provide designers for optimally design. Although this paper provides the expression of inductance for several geometric of the inductors, the un-optimized parameters are still the great issue in this field. The model of the present invention may be a good method to avoid this situation and present also simple and accurate results of those inductors.

S. Asgaran, "New accurate physics-based closed-form expressions for compact modeling and design of on-chip spiral inductors," The 14th International Conference on Microelectronics, pp. 247-250, December 2002.

This paper follows the Greenhouse's steps, and confronts the same problems. Even though the complicated geometric analysis was simplified, the awkward situation still exists. The model of the present invention can save the situation.

S. Jenei, B. K. J. C. Nauwelaers, and S. Decoutere, "Physics-based closed-form inductance expression for compact modeling of integrated spiral inductors," IEEE J. Solid-State Circuits. vol. 37, pp. 77-80, January 2002.

This paper also bases on Greenhouse's model, but it pushes the model further to calculate inductance of octagonal spiral inductors. Again, the awkvard situation does not be solved, and the model of the present invention is still a good tool.

Ansoft HFSS, 9.0 version, Ansoft, http://www.ansoftcom/products/hf.

This is a powerful simulation tool. The high frequency simulation system (HFSS) can solve any shape and scale devices in high frequency domain by evaluating the electromagnetic matrix. The parameters then can be output to calculate the characteristic values. However, time-consumption is a great issue here. More geometry complicates, more hours needs. The model of the present invention can save those waste CPU time.

SUMMARY OF THE INVENTION

In order to resolve the problems of the prior arts and the conventional technologies, the present invention address a method to predict inductance and self-resonant frequency of two-port on-chip freely suspended spiral inductors. This invention can easily evaluate the inductance and self-resonant frequency of polygon spiral inductors without complicated geometry analysis, reduce the time-consuming rather than the computer simulations, and save money and manpower when industries investigate RF inductor and inductor circuits, such as cell phones, communication systems, etc. when testing. The present invention can also solve the problems of complicated circuit analysis.

One of the purposes of the present invention is to determine the self-resonant frequency. Furthermore, the model of the present invention can explain the reasons that difference of the self-resonant frequency of different material with physical sense in which designers can optimally analyze products. Then the process of the posynomial expression might be not easy to understand and follow actually. Unlike the inconvenience of prior methods, the model of the present invention can show simple steps from evaluating the self-resonant frequency to determine the inductance of inductors. Fortunately, the model of the present invention also can determine the self-resonant frequency with different shape, such as circular, octagonal, and rectangular inductors.

In additional, the present invention not only considers the geometric parameters of the inductor but also the material characteristics. The present invention can avoid the complicated geometric analysis and presents the self-resonant frequency and the inductance associated with frequency with serious mathematical and physical sense. In other words, the present invention can evaluate the characteristic values of a spiral inductor without confusing circuit design, and also provide engineers and designers for optimizing the characteristics of the inductors.

Therefore, the present invention provides a novel and unsophisticated method to accurately evaluate the inductance and self-resonant frequency of RF on-chip spiral inductors. Differencing from the methods of the prior arts to calculate the inductance of a spiral inductor, the present invention evaluates the greater part of inductance of an inductor while altering the material of the inductor by means of modifying parameters of formulations in this invention. Thus, this invention provides a method to evaluate the self-resonant frequency of a spiral inductor. The determination of the self-resonant frequency helps the circuit designers and the microwave engineers to choose the appropriate inductance bandwidths.

DESCRIPTION OF THE PREFERRED EMBODIMENTS

In order to provide a thorough understanding and advantages of this invention, specific details and calculation steps will be set forth. Then the results will be compared with the conventional methods and commercial simulation tools. At the moment, difficult physical and mathematical techniques will not be described in details in order to simplify the description. A flow chart is shown in FIG. 1. The theorem will be described briefly in the following steps:

A. The Kramers-Kronig Relations for Metal:

The Kramers-Kronig relations compose one of the most elegant and general theorems in physics because their validity only depends on the principle of causality: the response cannot come before the stimulation. Thus, the relations will be so powerful to analyze the conjugate mathematical and physical phenomenon. Based on the Riemann-Lebesgue lemma, the characteristic of a conducting medium, and the electromagnetic field theory, the Kramers-Kronig relations have the form for real and imaginary parts:

$$\mathrm{Re}\chi(\omega) \approx \frac{\sigma_0}{\pi}\left[\pi^2\delta(\omega) - \frac{\ln\omega}{\omega}\right] + \frac{\alpha}{\omega_r^2 - \omega^2} \quad (1)$$

$$\mathrm{Im}\chi(\omega) \approx \frac{\sigma_0}{\omega} + \frac{\pi}{2}\frac{\alpha\delta(\omega - \omega_r)}{\omega_r} \quad (2)$$

where $\sigma_0$ is the dc conductivity of metal, $\omega$ is the frequency of electromagnetic (EM) field in the system, and $\omega_r$ is the self-resonant frequency. Then, the parameter $\alpha$ has the from:

$$\alpha = \frac{3n_e\mu_B^2\omega_r}{2\eta} - \frac{e^2n_e(\omega_r - \omega)}{2m_e}\sum_{m=0}^{[\frac{n-1}{2}]}(l_{\max} - 2mS)^2 \quad (3)$$

where $\eta$, $\mu_B$, $n_e$ and $m_e$ are Planck's constant, Bohr magneton, the free electron density and mass in material, respectively. For a spiral inductor with the geometry as shown in FIG. 2, the first and second terms in (3) are the paramagnetism and diamagnetism factors of the inductor material. The symbol [n−1] represents the Gaussian symbol where n is the number of turns. The parameters, $l_{max}$ and s, represent the maximum edge and line spacing of the inductor, respectively.

B. Determination of the Self-Resonant Frequency:

In metal, the kinetic energy of free electrons can be described by the dispersion relation:

$$E_L = \sqrt{3/5}\frac{\eta^2}{m_e}(3\pi^2n_e)^{1/3}\frac{\pi}{l_{total}} \quad (4)$$

where $l_{total}$ represents the total length of the inductor. According to electromagnetic field theory, there will be electric fields built up in the neighborhood of corners while an external electric field is applied on a conducting material. Thus, for a polygon spiral inductor, the quasi-electrostatic electric field built up in each corner has the form as the following that is calculated by variation principle:

$$\vec{E}(r) = \frac{1}{4\pi\varepsilon_0}\frac{q[\pi + 8\sin(\pi^2/4\beta)]^2}{8\varpi h\beta[\csc(\beta/2) - 1](\pi + \beta)}\hat{r} \quad (5)$$

where q is elementary charge (~1.6×10−19 C), $\overline{\omega}$ and h are width and height of the spiral inductor, respectively. Then, $\beta$ is the corner angle, and the field is centered at the outer apex of each corner.

By considering the Compton Effect, free electrons move near the corner would scatter and change their trajectories due to the electric field built up in the corner. Thus, the energy lost by the electron after scattering is calculated as the following:

$$E_C = \frac{\pi\varepsilon_0 \varpi h[\csc(\beta/2)-1]|\vec{E}|q}{NV^{2/3}\sqrt{\sigma_{eff}}}\bigg|_{-\infty}^{\mu}\left[\left(1+2\int_{-\infty}^{\infty}\frac{dr}{r^3}+\ldots\right)\csc\left(\frac{\pi-\beta}{2}\right)\right]^2 \quad (6)$$

$$= \begin{cases} \dfrac{q^2}{4NV^{2/3}\sqrt{\sigma_{eff}}} \dfrac{\left(\pi+8\sin\dfrac{\pi^2}{4\beta}\right)^2}{8\beta(\pi+\beta)}\csc^2\left(\dfrac{\pi-\beta}{2}\right), \text{ for } \beta<\pi \\[2ex] \dfrac{q^2}{4NV^{2/3}\sqrt{\sigma_{eff}}} \dfrac{(\pi+4\sqrt{2})^2}{4\pi}\dfrac{\pi}{2.7}, \text{ for } \beta=\pi \text{ (circular inductor)} \end{cases}$$

where r, N, V, and $\sigma_{eff}$ are the electronic incident path, the number of corners, the volume of polygon spiral inductor, and the effective cross section of the inductor, respectively. Here, the effective cross sections are equal to 0.101, 0.281, and 0.375 times the cross section, A, of rectangular, octagonal, and circular inductors (are shown in FIG. 2), respectively.

In above formula, the term $$1+2\int_{-\infty}^{\infty}\frac{dr}{r^3}+\ldots \quad (7)$$

means the trajectory function with the perturbation terms. The first term means the ideal trajectory function, and the second terms means perturbation from the near field such as the ground pad, etc. Since we assume the perturbations from the field is far from the infinity, the integral arguments are as the presentation. The recent investigations reveal that the substrate coupling effects could be neglected as long as the air gap is larger than 60 μm. For a micromachined inductor in the RFIC design, the reference ground point would be far away from the inductor. Thus, infinity assumption is reasonable and practical in the model. Nevertheless, if a reference ground plane is designed to close to the inductor, the SRF would be changed and can be calculated in (6) by changing the integral range $(r_m, \infty)$ to replace $(-\infty, \infty)$, where the factor $r_m$ presents a reference point for an inductor circuit. This factor indicates the loss or shift term for applying energy.

Thus, the self-resonant frequency of the inductor would be the same as the frequency of the resonating electron and be calculated by energy conservation as the following:

$$\omega_r = (E_L + N \cdot E_C)/\eta \quad (8)$$

The electron energy is equal to the kinetic energy plus the total energy lost in the corner field scattering.

C. Determination of the Inductance

After all, the inductance can be derived with the associated magnetic energy of EM field in the inductor:

$$L \equiv \frac{\int \vec{H}^* \cdot \vec{B} dv}{I^2} \quad (9)$$

$$\approx \frac{\mu_0 n_e I_{total}^3 \eta \omega_r}{2\pi\sigma_0^2 An}\left(\frac{\sigma_0}{\pi}\left[\pi^2\delta(\omega)-\frac{\ln\omega}{\omega}\right]+\frac{\alpha}{\omega_r^2-\omega^2}\right)$$

$$\left[\exp\left(\frac{\eta(\omega-\omega_r)}{k_B T}\right)+1\right]^{-1}$$

where $k_B$ and T are the Boltzmann's constant and absolute temperature, respectively. The free electron density and conductivity in above formula indicated that the inductance shall depend on the characteristic of material seriously.

D. Consider a Real Case:

Considering a 5 μm thick and 3.5 turns micromachined copper spiral inductor with restricting its geometric factors as $l_{max}$=300 μm, S=5 μm, and $\overline{\omega}$=15 μm. The self-resonant frequencies of rectangular, octagonal, circular inductors could be predicted well by means of utilizing (3)~(8), and the values are shown in table 1. Then, we could determine the require inductances at particular frequency by (9) and the values are shown as in table 2. In the table 1 and 2, we will see that the model of the present invention is examined by comparing with the contemporary calculations including the results derived from Greenhouse based model and Ansoft-HFSS simulator, respectively. A good S-parameter match between the measurement and HFSS simulation in a Smith chart which is shown in FIG. 3 presents the fact that the accuracy of the HFSS analysis is experimentally validated in the table 1 and 2.

TABLE 1

SELF-RESONANT FREQUENCY WITH DIFFERENT TYPE OF INDUCTOR

| Comparisons (n = 3.5) | Self-resonant frequency based on the model of the present invention (GHz) | Self-resonant frequency based on HFSS (GHz) |
|---|---|---|
| Rectangular inductor | 23.9 | 22.9 |
| Octagonal inductor | 24.9 | 23.6 |
| Circular inductor | 25.8 | 24.6 |

TABLE 2

COMPARISON OF INDUCTANCE OF RECTANGULAR INDUCTOR

| Comparisons (n = 3.5) | Self-resonant frequency (GHz) | Inductance @ 3 GHz (nH) | Inductance @ 5 GHz (nH) | Inductance @ 9 GHz (nH) |
|---|---|---|---|---|
| HFSS simulation | 22.9 | 4.27 | 4.38 | 4.92 |
| The model of the present invention | 23.9 | 4.13 | 4.25 | 4.74 |
| Greenhouse based model | X | 4.28 | 4.28 | 4.28 |

Symbol definition:
(1) X represents NOT available.
(2) In the analysis, the geometry of the inductor is designed as $l_{max}$ = 300 μm, s = 5 μm, and $\overline{\omega}$ = 15 μm, respectively. The material utilized here is copper with the properties of $n_e = 8 \times 10^{28}$ m$^{-3}$, $m_e = 9.11 \times 10^{-31}$ kg, and $\sigma_0 = 5.6 \times 10^7$ (Ωm)$^{-1}$ With the same HFSS simulation condition above, the inductance and self-resonant frequency of a copper rectangular inductor with similar geometric characteristics but 5.5 turns will be present in table 3:

TABLE 3

COMPARISON OF INDUCTANCE
OF RECTANGULAR INDUCTOR

| Comparisons (n = 5.5) | Self-resonant frequency (GHz) | Inductance @ 3 GHz (nH) | Inductance @ 5 GHz (nH) | Inductance @ 9 GHz (nH) |
|---|---|---|---|---|
| HFSS simulation | 19.4 | 6.01 | 6.21 | 7.23 |
| The model of the present invention | 19.9 | 5.95 | 6.20 | 7.30 |
| Greenhouse based model | X | 5.60 | 5.60 | 5.60 |

The inductance expression based on the model of the present invention is closely fitted with the simulation and experimental data for the structure of the spiral inductor with substrate removal. The above table also indicated that not alike the model of the present invention the greenhouse model does not provide the self-resonant frequency itself and can not determine the inductances associated with the frequency change. The comparison of inductance spectrum is shown as FIG. 4.

Note that again the model of the present invention could predict the self-resonant frequency and inductance of a on-chip freely spiral inductor and the designer could easily satisfy their requirements by means of altering the geometry and material of their inductors. The analytical method based on Kramers-Kronig relations and EM field theory could provide us mathematically convenience for the inductor design in physical sense.

All in all the advantages of the invention are as following:
1. The present invention can accurately predict inductance and self-resonant frequency of spiral inductor base on physical and mathematical method.
2. The present invention is a pioneer in providing a method to evaluate the self-resonant frequency of a spiral inductor.
3. The present invention can evaluate the inductance and self-resonant frequency associated with altering material of the spiral inductors.
4. The present invention can describe the behaviors of electrons when suffering electromagnetic field in a metal with solid state physical sense.
5. The present invention can evaluate the energies stored in corners in the spiral inductors.
6. By means of Kramers-Kronig Relations, field theory, and energy conservation, the present invention can describe the exchange of the electromagnetic field when the self-resonant frequency occurs.
7. The present invention can describe the difference of the stored energy associated with different type of inductors; such as rectangular, octagonal, and circular inductors.
8. For different corner angle of the polygon spiral inductors, the present invention can evaluate the stored energy in the corners of rectangular, octagonal, circular inductors, respectively.
9. The present invention can evaluate require results rapidly with simple computer calculation. For instance, this model in comparison with the Ansoft-HFSS simulation can have less CPU processing time which is about 6400 times difference while both analyses are performed by the computer with the equipments of 3.4 GHz double CPUs and 2048 MB DDR2 Rams.
10. Scientists can evaluate the stored energies and behaviors of the electrons with their physical intuition.

Figure 1:
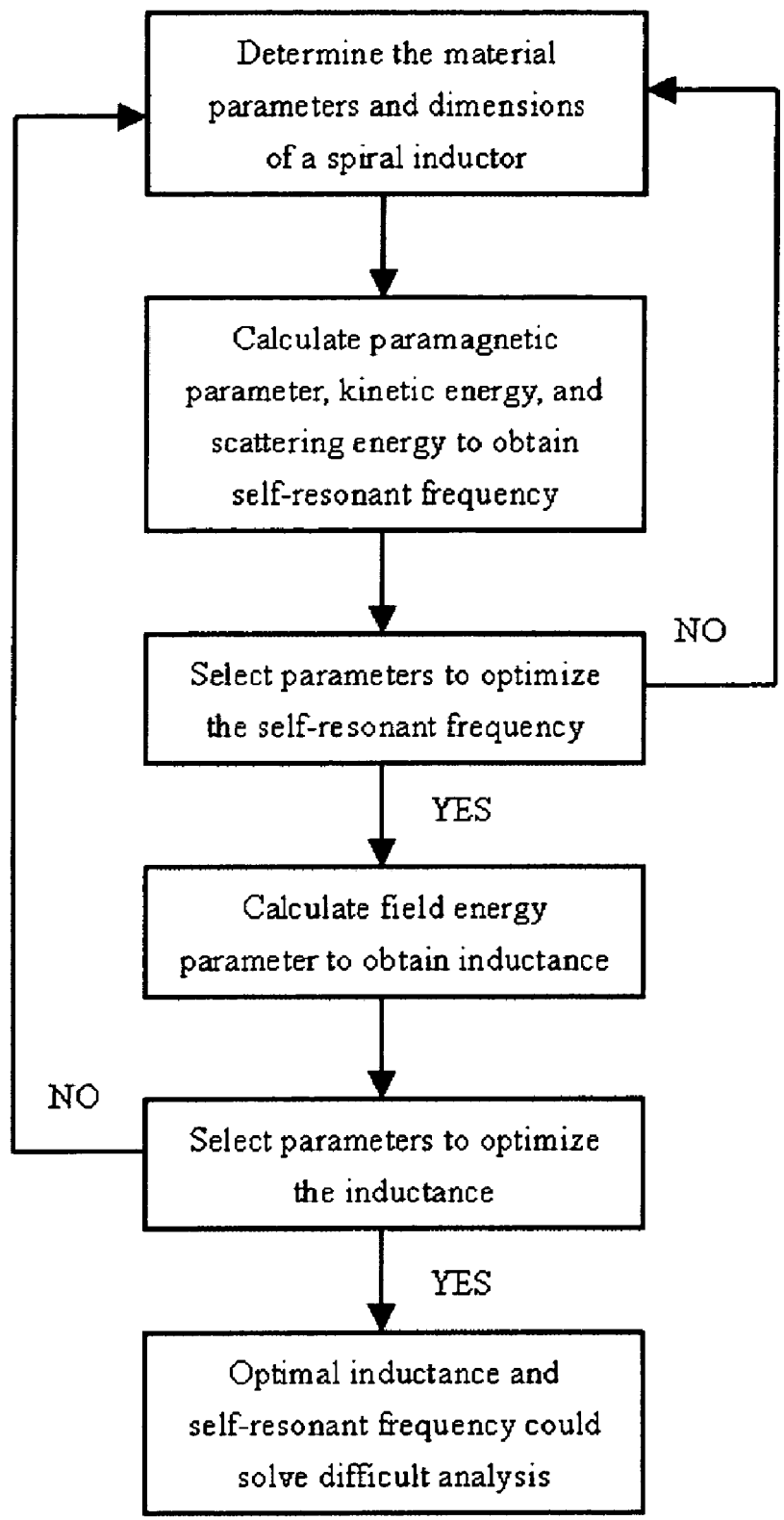
FIG. 1 A block flow chart illustrating the method of the present invention.
Figure 2A:
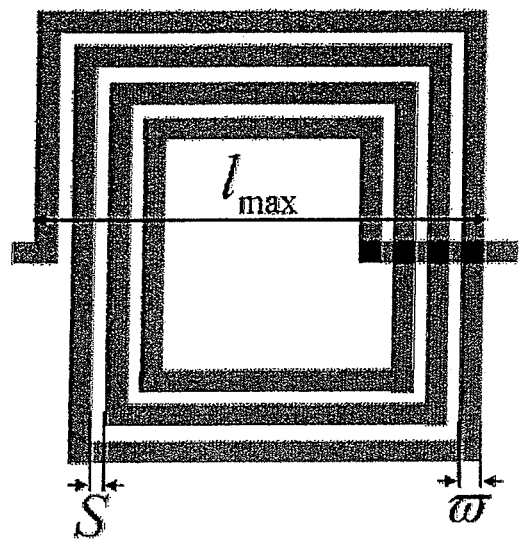
FIG. 2 The schematic diagram of the two-port spiral polygon inductor realizations: (a) rectangular, (b) octagonal, (c) circular. lmax, S, and $\overline{\omega}$ are the maximum edge, line spacing, and line width of the polygon inductor, respectively.
Figure 2B:
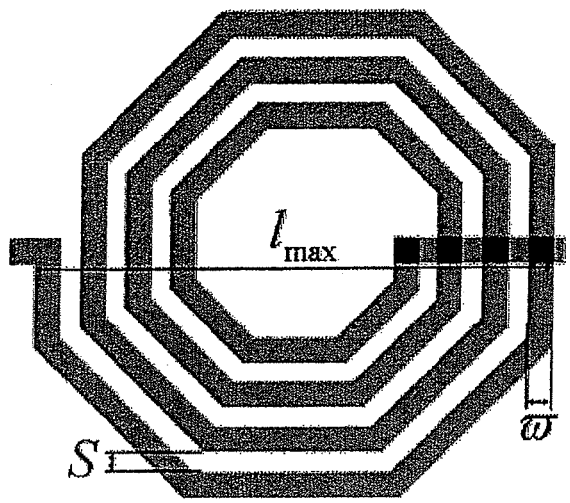
Figure 2C:
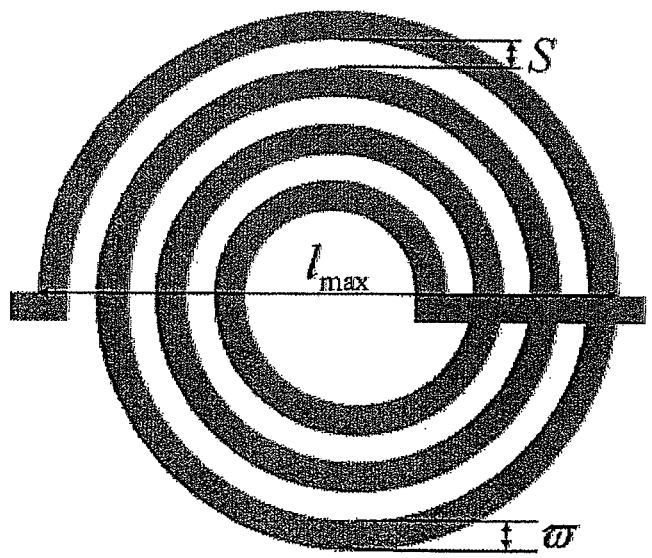
Figure 3:
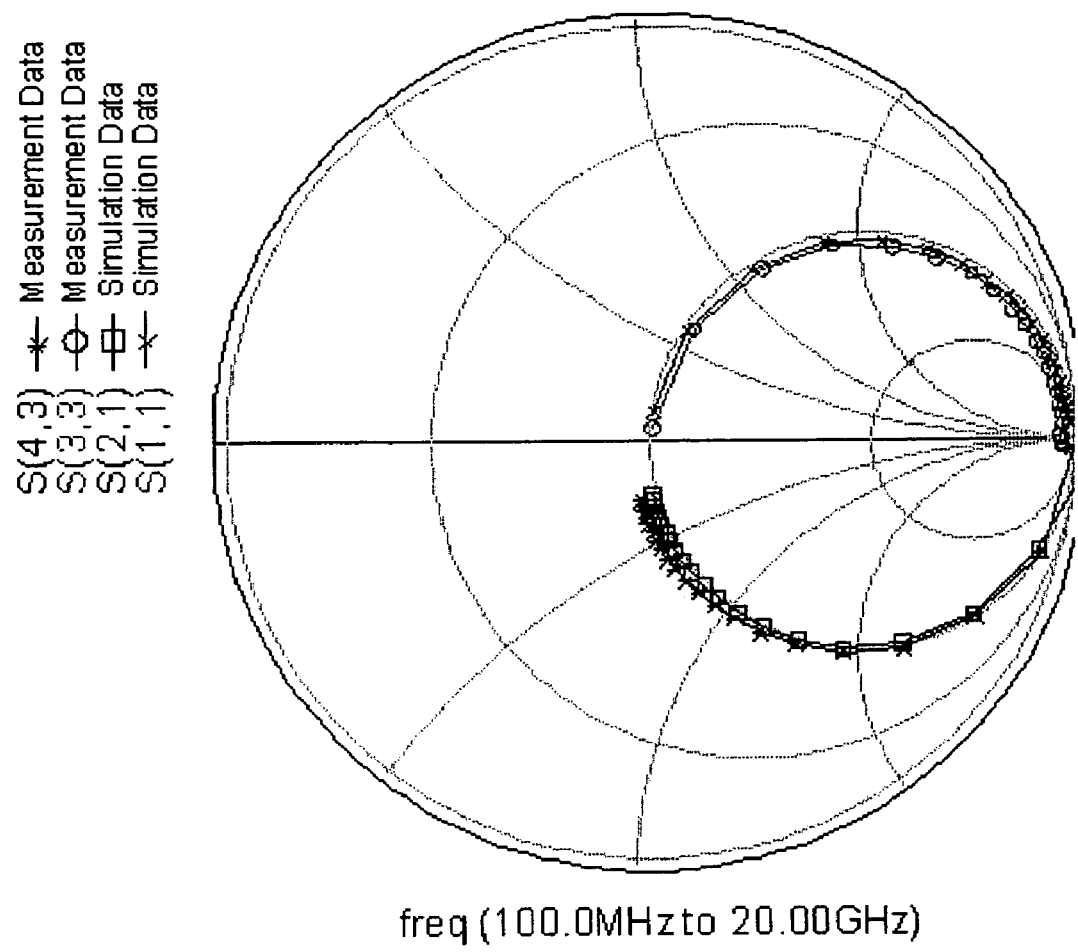
FIG. 3 The comparisons between the HFSS simulation and measurement results of the 3.5 turns, 5 μm thick two-port suspended rectangular inductor ($l_{max}$=300 μm, $\overline{\omega}$=15 μm, and S=5 μm). The frequency range is from 1 GHz to 20 GHz FIG. 4 The comparisons of the model of the present invention, Greenhouse based model, and HFSS simulation data of the (a) 3.5 turns and (b) 5.5 turns, 5 μm thick two-port suspended rectangular inductor ($l_{max}$=300 μm, $\overline{\omega}$=15 μm, and S=5 μm). The frequency range is from 1 GHz to 9 GHz.
Figure 4A:
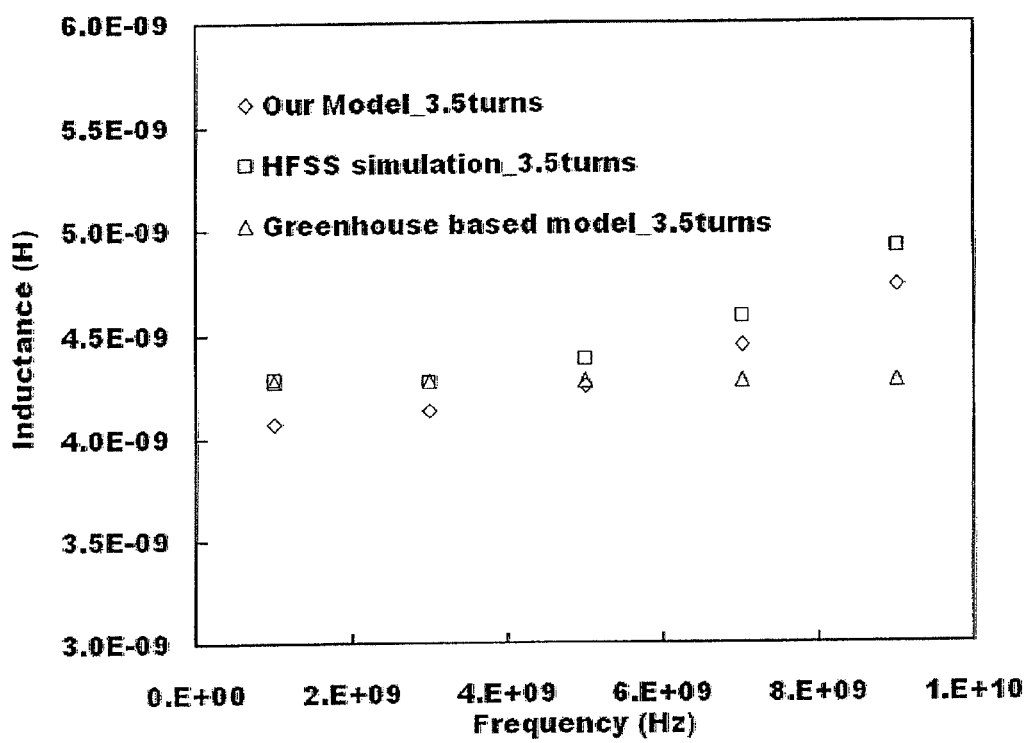
Figure 4B:
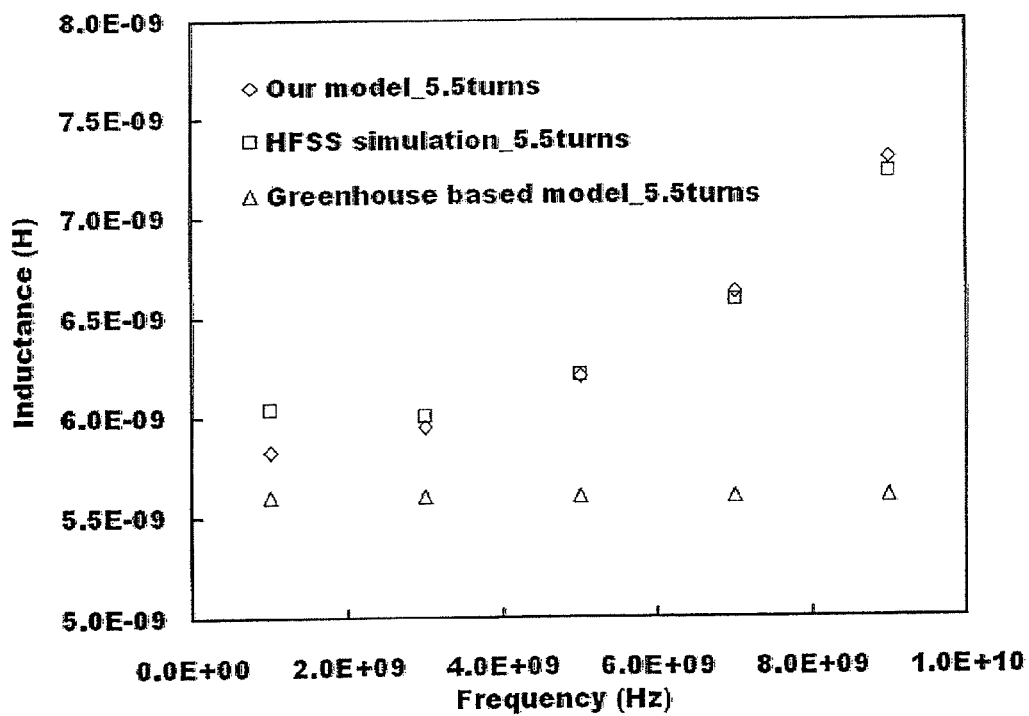

What is claimed is:

1. A method for predicting inductance and self-resonant frequency of a spiral inductor, characterized by the steps of:
   (1). determining the material parameters and dimensions of a spiral inductor;
   (2). calculating magnetic factor α for determining paramagnetic and diamagnetic characteristic constrained by material and geometry of the spiral inductor determined in step (1);
   (3). evaluating kinetic energy ($E_L$), quasi-electrostatic electric field ($\vec{E}(r)$) constrained in corners in the inductor, and scattering energy ($E_C$) due to the electric field in the corners;
   (4). determining the self-resonant frequency $\omega_r$ of the two-port freely suspended spiral inductor;
       according to the material parameters and dimensions of the inductor determined in step (1);
   (5). relying on the result in step (4) to calculate the frequency-dependent inductance of the two-port freely suspended spiral inductor;
   (6). relying on the results of steps (1) and (4) to determine the inductance;

thus, the self-resonant frequency and inductance can be obtained
   wherein said kinetic energy ($E_L$), said quasi-electrostatic electric field $\vec{E}(r)$, and said scattering energy ($E_C$) can be calculated as:

$$E_L \sqrt{3/5} \frac{\eta^2}{m_e} (3\pi^2 n_e)^{1/3} \frac{\pi}{l_{total}},$$

where $l_{total}$ represents the total length of the inductor; and $$\vec{E}(r) = \frac{1}{4\pi\varepsilon_0} \frac{q[\pi + 8\sin(\pi^2/4\beta)]^2}{8\varpi h\beta[\csc(\beta/2) - 1](\pi + \beta)} \hat{r},$$

where q is elementary charge, $\overline{\omega}$ and h are width and height of the spiral inductor, respectively and $\epsilon_0$ is vacuum permittivity; then, β is corner angle, and the electric field is centered at the outer apex of each corner; and $$E_C = \frac{\pi\varepsilon_0 \varpi h[\csc(\beta/2) - 1] |\vec{E}|^\mu q}{N V^{2/3} \sqrt{\sigma_{eff}}} \left[ \left(1 + 2\int_{-\infty}^{\infty} \frac{dr}{r^3} + \ldots \right) \csc\left(\frac{\pi - \beta}{2}\right) \right]^2$$

-continued $$= \begin{cases} \dfrac{q^2}{4NV^{2/3}\sqrt{\sigma_{e\!f\!f}}} \dfrac{\left(\pi + 8\sin\dfrac{\pi^2}{4\beta}\right)^2}{8\beta(\pi+\beta)} \csc^2\left(\dfrac{\pi-\beta}{2}\right), & \text{for } \beta < \pi \\ \dfrac{q^2}{4NV^{2/3}\sqrt{\sigma_{e\!f\!f}}} \dfrac{(\pi+4\sqrt{2})^2}{4\pi} \dfrac{\pi}{2.7}, & \text{for } \beta = \pi \text{ (circular inductor)} \end{cases}$$

where r, N, V, and $\sigma_{e\!f\!f}$ are electronic incident path, number of corners, volume of polygon spiral inductor, and effective cross section of the inductor, respectively.

2. The method for predicting inductance and self-resonant frequency of a spiral inductor as set forth in claim 1, wherein said magnetic factor $\alpha$ can be calculated as:

$$\alpha = \frac{3n_e\mu_B^2\omega_r}{2\hbar} - \frac{e^2 n_e(\omega_r - \omega)}{2m_e} \sum_{m=0}^{[n-1]} (l_{max} - 2ms)^2$$

where $\omega_r$, $\eta$, $\mu_B$, $n_e$ and $m_e$ are self-resonant frequency, Planck's constant, Bohr magneton, the free electron density and mass in material, respectively; and the symbol [n−1] represents the Gaussian symbol where n is the number of turns, the parameters, $l_{max}$ and s represent the maximum edge and line spacing of the inductor, respectively.

3. The method for predicting inductance and self-resonant frequency of a spiral inductor as set forth in claim 1, wherein said self-resonant frequency $\omega_r$ can be determined as:
$\omega_r = (E_L + N \cdot E_C)/\eta$ and the expression obeys a law of energy conservation.

4. The method for predicting inductance and self-resonant frequency of a spiral inductor as set forth in claim 1, wherein said frequency-dependent inductance of a rectangular inductor can be calculated as:

$$L \approx \frac{\mu_0 n_e l_{total}^3 \eta \omega_r}{2\pi\sigma_0^2 An} \left( \frac{\sigma_0}{\pi}\left[\pi^2\delta(\omega) - \frac{\ln\omega}{\omega}\right] + \frac{\alpha}{\omega_r^2 - \omega^2} \right)\left[\exp\left(\frac{\eta(\omega-\omega_r)}{k_B T}\right) + 1\right]^{-1}$$

where $\sigma_0$, A, and $\mu_0$ are the dc conductivity of metal, the cross section of the inductor, and the permeability in free space, respectively; $k_B$ and T are the Boltzmann's constant and absolute temperature, respectively.

5. The method for predicting inductance and self-resonant frequency of a spiral inductor as set forth in claim 1, wherein said material of the inductors can be any inductive material other than a ferromagnetic material.

6. The method for predicting inductance and self-resonant frequency of a spiral inductor as set forth in claim 1, wherein said dimensions of the spiral inductor are the maximum edge, number of turns, spacing of track, width of track, height of track, and total length of the inductor.

7. The method for predicting inductance and self-resonant frequency of a spiral inductor as set forth in claim 1, wherein said kinetic energy is the minimum energy for free electrons to move freely within the inductor at high frequency.

8. The method for predicting inductance and self-resonant frequency of a spiral inductor as set forth in claim 1, wherein said effective cross section is equal to 0.101 times a cross section of a rectangular inductor, 0.281 times a cross section of an octagonal inductor, or 0.375 times a cross section of an octagonal inductor.

9. The method for predicting inductance and self-resonant frequency of a spiral inductor as set forth in claim 1, wherein said evaluated quasi-electrostatic field and the scattering energy are constrained in the corners of the inductor.

10. The method for predicting inductance and self-resonant frequency of a spiral inductor as set forth in claim 1, wherein said electric field is centered at the outer apex of each corner.

11. The method for predicting inductance and self-resonant frequency of a spiral inductor as set forth in claim 1, wherein said inductor can be rectangular, octagonal, or circular.

12. The method for predicting inductance and self-resonant frequency of a spiral inductor as set forth in claim 5, wherein said material is copper.

13. The method for predicting inductance and self-resonant frequency of a spiral inductor as set forth in claim 1, wherein said inductor is a two-part on-chip freely suspended inductor and said cross section is the product of height and width of a track.

14. The method for predicting inductance and self-resonant frequency of a spiral inductor as set forth in claim 9, wherein said inductor is a two-part on-chip freely suspended inductor and said reference point of the scattering energy is accounted for by altering and shifting said integral term of the scattering energy.

15. The method for predicting inductance and self-resonant frequency of a spiral inductor as set forth in claim 10, wherein said corner of the inductor is assumed to have an angle of $-\pi$ and the shape of the spiral inductor is circular.

16. The method for predicting inductance and self-resonant frequency of a spiral inductor as set forth in claim 1, wherein said inductor is a two-part on-chip freely suspended inductor and said self-resonant frequency and inductance are determined by means of altering the parameters of the inductor.

17. The method for predicting inductance and self-resonant frequency of a spiral inductor as set forth in claim 16, wherein the spiral inductor is being designed by means of altering the material parameters and dimension of the inductor.

18. The method for predicting inductance and self-resonant frequency of a spiral inductor as set forth in claim 1, wherein said geometry factors is the dimensions of the spiral inductor.

* * * * *